United States Patent
Nakashimo

(10) Patent No.: US 10,185,343 B2
(45) Date of Patent: Jan. 22, 2019

(54) SEMICONDUCTOR CIRCUIT

(71) Applicant: ABLIC Inc., Chiba-shi, Chiba (JP)

(72) Inventor: Takao Nakashimo, Chiba (JP)

(73) Assignee: ABLIC INC., Chiba-Shi (JP)

( * ) Notice: Subject to any disclaimer, the term of this patent is extended or adjusted under 35 U.S.C. 154(b) by 0 days.

(21) Appl. No.: 15/928,417

(22) Filed: Mar. 22, 2018

(65) Prior Publication Data

US 2018/0275702 A1    Sep. 27, 2018

(30) Foreign Application Priority Data

Mar. 24, 2017 (JP) ................. 2017-059970

(51) Int. Cl.
| | | |
|---|---|---|
| *G05F 1/563* | (2006.01) | |
| *G05F 1/575* | (2006.01) | |
| *H03K 17/687* | (2006.01) | |

(52) U.S. Cl.
CPC .......... *G05F 1/575* (2013.01); *H03K 17/687* (2013.01)

(58) Field of Classification Search
CPC . G05F 1/567; G05F 1/575; G05F 1/56; G11C 5/14; H03K 17/0826
USPC ....... 323/222, 224, 226, 266, 267, 271–276, 323/281, 288, 311–312
See application file for complete search history.

(56) References Cited

U.S. PATENT DOCUMENTS

| | | | | |
|---|---|---|---|---|
| 5,216,353 A * | 6/1993 | Mori | ............ | G05F 1/563 323/224 |
| 5,828,081 A | 10/1998 | Yoshida et al. | | |
| 7,570,035 B2 * | 8/2009 | Kleveland | ............ | G05F 1/575 323/273 |
| 9,618,951 B2 * | 4/2017 | Kobayashi | ............ | G05F 1/468 |
| 9,874,887 B2 * | 1/2018 | Yan | ............ | G05F 1/565 |
| 2007/0247133 A1* | 10/2007 | Isobe | ............ | G11C 5/147 323/312 |

FOREIGN PATENT DOCUMENTS

| | | |
|---|---|---|
| JP | H02-288366 A | 11/1990 |
| JP | H07-283370 A | 10/1995 |

* cited by examiner

*Primary Examiner* — Rajnikant Patel
(74) *Attorney, Agent, or Firm* — Brinks Gilson & Lione

(57) ABSTRACT

A semiconductor circuit converts an applied input voltage into a desired output voltage and outputs the same from a voltage output terminal. A first resistor, a second resistor, and a third resistor are connected in series between the voltage output terminal and a ground terminal. When a switch is brought to an open state, an output voltage based on a voltage divided by a combined resistance of the second and third resistors and the first resistor is supplied. When the switch is brought to a closed state, an output voltage based on a voltage divided by the second and first resistors is supplied. The semiconductor circuit has a configuration of controlling the resistance value of each voltage division resistor by a control signal from the outside.

6 Claims, 4 Drawing Sheets

|  | Voltage Level of Control Signal S2 | Operation of OP Amp | State of Transistor TR2 |
| --- | --- | --- | --- |
| First State | S2 > Threshold TH3 > Threshold TH2 | Effective | OFF (Connecting Resistor R3) |
| Second State | Threshold TH3 > S2 > Threshold TH2 | Effective | ON (Shortening Resistor R3) |
| Third State | Threshold TH3 > Threshold TH2 > S2 | Ineffective | ON (Shortening Resistor R3) |

FIG. 4

SEMICONDUCTOR CIRCUIT

RELATED APPLICATIONS

This application claims priority under 35 U.S.C. § 119 to Japanese Patent Application No. 2017-059970 filed on Mar. 24, 2017, the entire content of which is hereby incorporated by reference.

BACKGROUND OF THE INVENTION

1. Field of the Invention

The present invention relates to a semiconductor circuit.

2. Background Art

In screening of a semiconductor circuit, there is a case where a high voltage is applied to a MOS transistor included in the semiconductor circuit. In general, a gate terminal of a MOS transistor is controlled by a control circuit in such a manner that a prescribed voltage is applied to the gate terminal. There has therefore been a case where in order to apply the high voltage to the MOS transistor, an additional circuit and an additional terminal have been used in addition to a circuit used for the normal operation of the semiconductor circuit.

There has heretofore been known a method of inserting an additional circuit between a protection circuit connected to a gate terminal of a MOS transistor and protecting a high voltage of a predetermined voltage or more to be applied thereto, and the gate terminal, prohibiting the operation of the protection circuit by the additional circuit, and applying an inspection voltage of a predetermine voltage or more (Japanese Patent Application Laid-Open H2-288366, for example).

There has been also known a method of connecting an additional gate terminal which is a terminal used only upon an inspection such as screening and is provided without via a control circuit, between a gate terminal of a MOS transistor and the control circuit, and applying an inspection voltage of a predetermined voltage or more to the additional gate terminal (Japanese Patent Application Laid-Open H7-283370, for example).

SUMMARY OF THE INVENTION

In a related art, however, since a gate terminal of a MOS transistor for an output driver is provided with an additional circuit and an additional terminal, these additions may affect the original operation of the MOS transistor.

The present invention has been made to provide a semiconductor circuit which is configured to control the resistance value of a voltage division resistor by a control signal from the outside and which can be inspected with a simple configuration without affecting the original operation of a MOS transistor.

According to one embodiment of the present invention there is provided a semiconductor circuit converting an input voltage applied thereto to a predetermined output voltage and supplying the same from a voltage output terminal, the semiconductor circuit, comprising: a MOS transistor; an operational amplifier; a first resistor; a second resistor; a third resistor; an external terminal; and a switch, the first resistor, the second resistor, and the third resistor being connected in series between the voltage output terminal and a ground terminal in this order, the MOS transistor having a source terminal connected to an input voltage terminal to which the input voltage is applied, and a drain terminal connected to the voltage output terminal, the operational amplifier having a non-inversion input terminal to which a reference voltage is applied, an inversion input terminal to which a voltage of a connection point of the first resistor and the second resistor is applied, and an output terminal to which a gate terminal of the MOS transistor is connected, the switch having a control terminal connected to the external terminal and being connected in parallel with the third resistor, an open state of the switch brought by a signal input to the external terminal, permitting an output of the output voltage from the voltage output terminal based on a voltage divided between the first resistor and a combined resistance of the second resistor the third resistor, and a closed state of the switch brought by the signal input to the external terminal, permitting an output of the output voltage from the voltage output terminal based on a voltage divided between the first resistor and the second resistor.

According to the present invention, there can be provided a semiconductor circuit which is configured to control the resistance value of a voltage division resistor by a control signal from the outside and which can be inspected with a simple configuration without affecting the original operation of a MOS transistor.

BRIEF DESCRIPTION OF THE DRAWINGS

FIG. 4 is a table illustrating the relationship between each state according to the third embodiment, the operation of an operational amplifier, and a state of a MOS transistor.

DETAILED DESCRIPTION OF THE PREFERRED EMBODIMENTS

First Embodiment

A first embodiment of the present invention will hereinafter be described with reference to the accompanying drawings.

<Configuration of Semiconductor Circuit>

Figure 1:
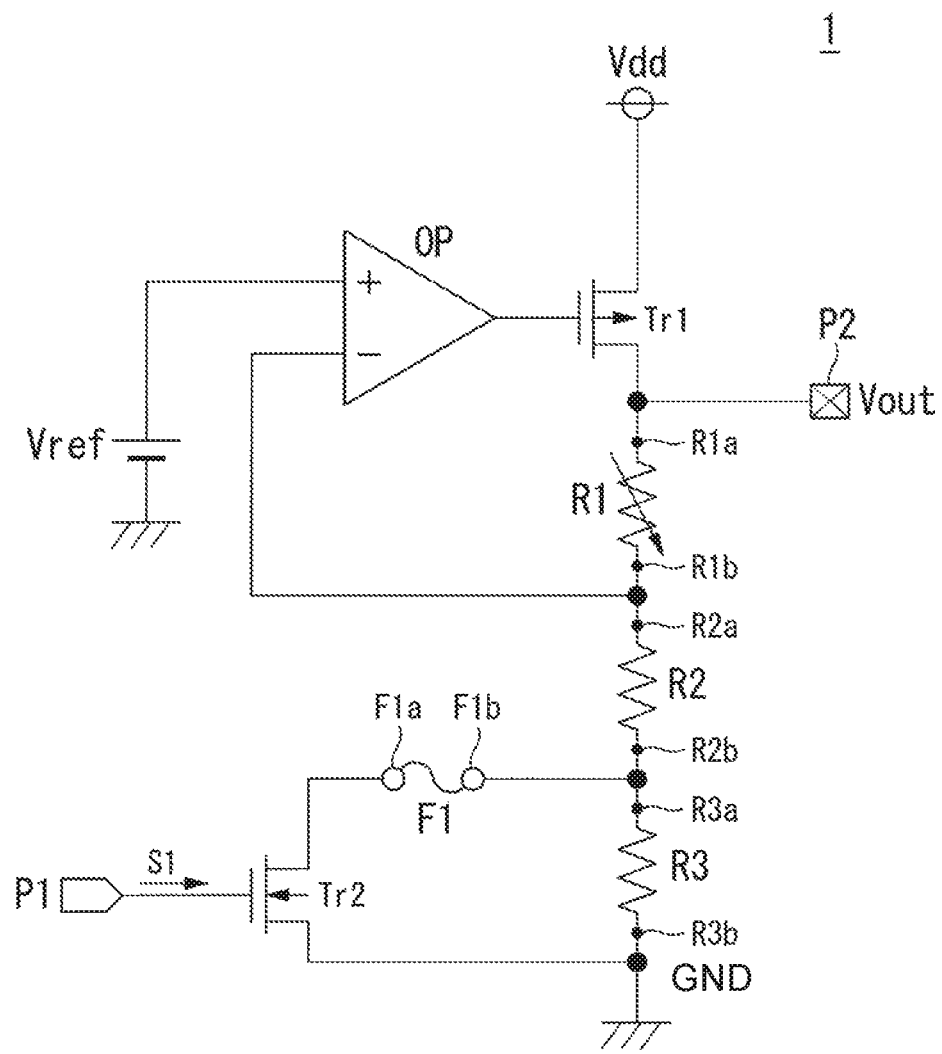
FIG. 1 is a circuit diagram illustrating a semiconductor circuit according to a first embodiment.

FIG. 1 is a circuit diagram illustrating a semiconductor circuit 1 according to the first embodiment.

As illustrated in FIG. 1, the semiconductor circuit 1 is equipped with an operational amplifier OP, a MOS (Metal-Oxide-Semiconductor) transistor Tr1, a MOS transistor Tr2, a fuse F1, a first resistor R1, a second resistor R2, a third resistor R3, and an external terminal P1. The MOS transistor Tr1 is, for example, a P-type MOSFET (Metal-Oxide-Semiconductor Field-Effect Transistor). Further, the MOS transistor Tr2 is, for example, an N-type MOSFET.

The operational amplifier OP is equipped with a non-inversion input terminal, an inversion input terminal, and an output terminal. The MOS transistor Tr1 is equipped with a gate terminal, a source terminal, and a drain terminal. The MOS transistor Tr2 is equipped with a gate terminal, a source terminal, and a drain terminal. The fuse F1 is equipped with a first terminal (terminal F1a hereinafter) and a second terminal (terminal F1b hereinafter). The first resistor R1 is equipped with a first terminal (terminal R1a hereinafter) and a second terminal (terminal R1b hereinafter). The second resistor R2 is equipped with a first terminal (terminal R2a hereinafter) and a second terminal (terminal R2b hereinafter). The third resistor R3 is equipped with a first terminal (terminal R3a hereinafter) and a second terminal (terminal R3b hereinafter).

The first resistor R1, the second resistor R2, and the third resistor R3 are connected in series. Specifically, the terminal R1b and the terminal R2a are connected. Further, the terminal R2b and the terminal R3a are connected. The terminal R3b is grounded through the ground terminal GND. The third resistor R3 and the MOS transistor Tr2 are connected to each other in parallel through the fuse F1. Specifically, the drain terminal of the MOS transistor Tr2 and the terminal R3b are connected. The source terminal of the MOS transistor Tr2 and the terminal F1a are connected. The terminal F1b and the terminal R3a are connected. Further, the gate terminal of the MOS transistor Tr2 and the external terminal P1 are connected.

A reference voltage Vref used for comparison with a feedback voltage of the operational amplifier OP is connected to the non-inversion input terminal of the operational amplifier OP. The gate terminal of the MOS transistor Tr1 is connected to the output terminal of the operational amplifier OP. The source terminal of the MOS transistor Tr1 is connected to the Vdd terminal which is an input voltage terminal to which an input voltage Vdd to the semiconductor circuit 1 is applied. The drain terminal of the MOS transistor Tr1 is connected to the terminal R1a. A potential of a connection point (connection point of the terminals R1b and R2a) of the first resistor R1 and the second resistor R2 is applied (connected) to the inversion input terminal of the operational amplifier OP. Further, a potential of a connection point (connection point of the drain terminal of the MOS transistor Tr1 and terminal R1a) of the MOS transistor Tr1 and the first resistor R1 is supplied as an output voltage Vout of the semiconductor circuit 1. Here, a voltage output terminal P2 from which the output voltage Vout is supplied is connected to the connection point of the drain terminal of the MOS transistor Tr1 and the terminal R1a.

<Operation of Semiconductor Circuit 1>

The operation of the semiconductor circuit 1 will hereinafter be described.

The semiconductor circuit 1 is a circuit which supplies a desired output voltage (output voltage Vout1 hereinafter) from the voltage output terminal P2. The desired voltage is obtained by conversion of the input voltage Vdd applied to the semiconductor circuit 1 through the Vdd terminal which is the input voltage terminal. The output voltage Vout1 is a voltage at which a voltage obtained by dividing the output voltage Vout by a combined resistance (combined resistance Rc hereinafter) of the second resistor R2 and the third resistor R3, and the first resistor R1, and the reference voltage Vref become equal.

When the resistance value of the first resistor R1 is assumed to be R1, the resistance value of the second resistor R2 is assumed to be R2, the resistance value of the third resistor R3 is assumed to be R3, the voltage value of the reference voltage Vref is assumed to be Vref, and the voltage value of the output voltage Vout1 is assumed to be Vout1, the relationship between Vout, R1, R2, R3 and Vref is represented by an equation (1):

$$Vout1=(Vref/(R2+R3))\times(R1+R2+R3) \qquad (1)$$

Here, when the fuse F1 is not cut through melting, the MOS transistor Tr2 is controlled in terms of its ON and OFF states according to a voltage value of a signal (signal S1 hereinafter) input from the external terminal P1 to the gate terminal of the MOS transistor Tr2. When the MOS transistor Tr2 is controlled to the ON state, the MOS transistor Tr2 short-circuits both ends of the third resistor R3. In other words, when the MOS transistor Tr2 is in the ON state, the terminal R2b of the second resistor R2 is grounded through the ground terminal GND. In this case, the semiconductor circuit 1 outputs an output voltage Vout (output voltage Vout2 hereinafter) in such a manner that a voltage obtained by dividing the output voltage Vout by the first resistor R1 and the second resistor R2, and the reference voltage Vref become equal to each other. When the voltage value of the output voltage Vout2 is assumed to be Vout2, the relationship between Vout2, R1, R2 and Vref is represented by an equation (2).

$$Vout2=(Vref/R2)\times(R1+R2) \qquad (2)$$

Here, each of the first resistor R1 and the second resistor R2 has a resistance value at which the voltage obtained by dividing the input voltage Vdd by the first resistor R1 and the second resistor R2 becomes lower than the reference voltage Vref. Thus, the operational amplifier OP continues to output a signal of a low level (the same potential as ground) from its output terminal to the gate terminal of the MOS transistor Tr1. That is, the input voltage Vdd continues to be applied between the gate terminal of the MOS transistor Tr1 and the source terminal thereof, and hence the MOS transistor Tr1 is screened.

Accordingly, the semiconductor circuit 1 is capable of screening the MOS transistor Tr1 without providing an additional circuit and an additional terminal at the gate terminal of the MOS transistor Tr1.

When the fuse F1 is cut through melting, the connection between the third resistor R3 and the MOS transistor Tr2 is cut off. In other words, when the fuse F1 is cut through melting, both ends of the third resistor R3 are not short-circuited even though the MOS transistor Tr2 is brought into the ON state. Thus, when the fuse F1 is cut through melting, the semiconductor circuit 1 outputs the output voltage Vout1 irrespective of the operating state of the MOS transistor Tr2.

<Summary of First Embodiment>

As described above, when the MOS transistor Tr2 is controlled to the OFF state, the semiconductor circuit 1 according to the present embodiment applies an inspection voltage higher than a normal voltage between the gate terminal of the MOS transistor Tr1 and the source terminal thereof. Thus, the semiconductor circuit 1 according to the present embodiment is capable of applying an inspection voltage higher than a prescribed voltage between the gate terminal of the MOS transistor Tr1 and the source terminal thereof upon execution of an inspection such as screening.

Thus, according to the semiconductor circuit 1 according to the present embodiment, the inspection of the MOS transistor Tr1 can be carried out with a simple configuration without affecting the original operation of the MOS transistor Tr1.

Also, when the MOS transistor Tr2 is controlled to the OFF state, the semiconductor circuit 1 according to the present embodiment outputs a desired output voltage (output voltage Vout1). According to the semiconductor circuit 1 according to the present embodiment, it is possible to confirm whether the first resistor R1, the second resistor R2, and the third resistor R3 are set (trimmed) to a resistance value at which the desired output voltage can be supplied.

Further, the semiconductor circuit 1 according to the present embodiment is equipped with the fuse F1 connected in series between the MOS transistor Tr2 and the third resistor R3. The connection between the third resistor R3 and the MOS transistor Tr2 is cut off accompanied by the melting of the fuse F1.

Here, only upon execution of the inspection such as screening, the semiconductor circuit 1 preferably outputs an inspection voltage (output voltage Vout2) and outputs a desired output voltage (output voltage Vout1) after the inspection. According to the semiconductor circuit 1 according to the present embodiment, the output voltage after the inspection (cutting of fuse F1 through melting) can be made to be a desired output voltage by cutting the fuse F1 after the inspection such as screening.

Second Embodiment

A second embodiment of the present invention will hereinafter be described with reference to the accompanying drawings.

Here, an external terminal P1 is preferably an external terminal used for the normal operation of a semiconductor circuit. The second embodiment will describe the case where the external terminal P1 is a chip enable terminal which switches the operation of a semiconductor circuit 2 between effective and ineffective.

Incidentally, configurations similar to those in the aforementioned embodiment are assigned the same reference numerals, and their description will be omitted.
<Configuration of Semiconductor Circuit 2>

Figure 2:
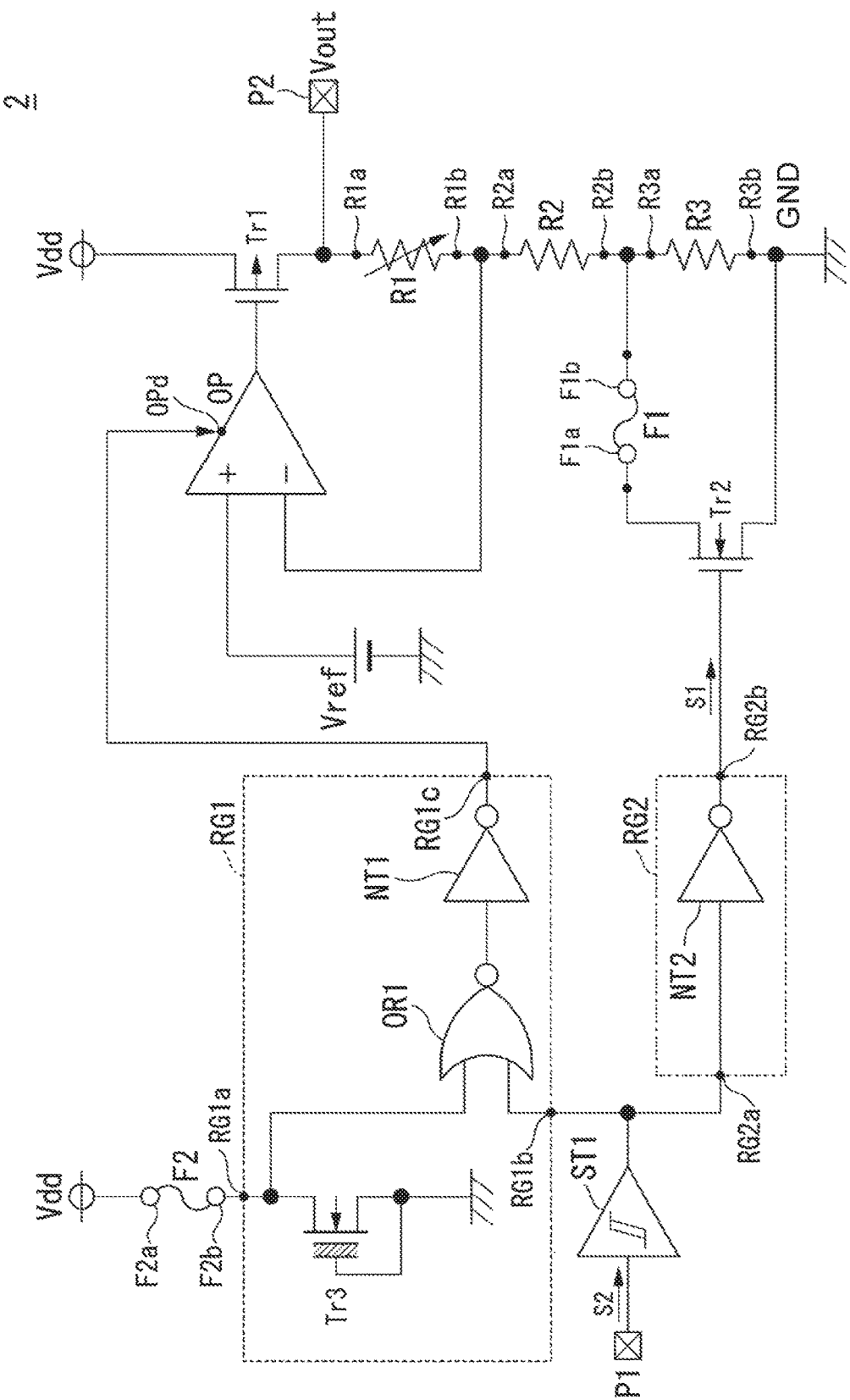
FIG. 2 is a circuit diagram illustrating the configuration of a semiconductor circuit according to a second embodiment.

FIG. 2 is a circuit diagram illustrating the configuration of the semiconductor circuit 2 according to the second embodiment.

As illustrated in FIG. 2, the semiconductor circuit 2 according to the present embodiment is equipped with an operational amplifier OP, a MOS transistor Tr1, a MOS transistor Tr2, a fuse F1, a first resistor R1, a second resistor R2, a third resistor R3, the external terminal P1, a voltage output terminal P2, a first logic circuit RG1, a second logic circuit RG2, and a fuse F2. The first logic circuit RG1 is equipped with a first terminal (terminal RG1a hereinafter), a second terminal (terminal RG1b hereinafter), and a third terminal (terminal RG1c hereinafter). The second logic circuit RG2 is equipped with a first terminal (terminal RG2a hereinafter) and a second terminal (terminal RG2b hereinafter). The fuse F2 is equipped with a first terminal (terminal F2a hereinafter) and a second terminal (terminal F2b hereinafter).

Further, in the present embodiment, the operational amplifier OP is equipped with a fourth terminal (terminal OPd hereinafter). The terminal OPd is an input terminal input with a control signal (control signal S2 hereinafter) which controls the operation of the operational amplifier OP (semiconductor circuit 2) to be effective or ineffective.

The terminal OPd and the external terminal P1 are connected through the first logic circuit RG1. Specifically, the external terminal P1 and the terminal RG1b are connected through a Schmidt trigger ST1. The terminal RG1c and the terminal OPd are connected. An input voltage Vdd is applied to the first logic circuit RG1 through the fuse F2. Specifically, the terminal F2a and the Vdd terminal which is the input voltage terminal are connected. The terminal F2b and the terminal RG1a are connected.

Further, a gate terminal of the MOS transistor Tr2 and the external terminal P1 are connected through the second logic circuit RG2. Specifically, the external terminal P1 and the terminal RG2a are connected through the Schmidt trigger ST1. The terminal RG2b and the gate terminal of the MOS transistor Tr2 are connected.

The first logic circuit RG1 is equipped with a MOS transistor Tr3, an OR circuit OR1, and a NOT circuit NT1. The MOS transistor Tr3 is, for example, a depletion type N type MOSFET. A gate terminal of the MOS transistor Tr3 and a source terminal thereof are grounded. A drain terminal of the MOS transistor Tr3 and the terminal RG1a are connected. The potential of the terminal RG1b and the potential of the drain terminal of the MOS transistor Tr3 are input to the OR circuit OR1 as signals.

The second logic circuit RG2 is equipped with a NOT circuit NT2. Specifically, the NOT circuit NT2 is connected between the terminal RG2a and the terminal RG2b.

Incidentally, the NOT circuit NT1 and the NOT circuit NT2 are provided corresponding to the operation logic of the terminal OPd of the operational amplifier OP and the MOS transistor Tr2.
<Operation of Semiconductor Circuit 2>

The operation of the semiconductor circuit 2 will be described below.

As described above, the external terminal P1 is of the chip enable terminal. When the semiconductor circuit 2 is made effective in one example of the present embodiment, a high level potential is applied to the external terminal P1 as the control signal S2. Further, when the semiconductor circuit 2 is made ineffective, a low level potential is applied to the external terminal P1 as the control signal S2. In other words, when a high level signal is provided to the terminal OPd of the operational amplifier OP, the operation of the operational amplifier OP is effective. Further, when a low level signal is provided to the terminal OPd of the operational amplifier OP, the operation of the operational amplifier OP is ineffective.
<Operation of First Logic Circuit RG1 Based on Control Signal S2>

When the semiconductor circuit 2 is in an operating state (state with the input voltage Vdd being applied) and the fuse F2 is not cut through melting, the potential of the drain terminal of the MOS transistor Tr3 is the same potential (high level) as the input voltage Vdd. Thus, when the semiconductor circuit 2 is in the operating state and the fuse F2 is not cut through melting, the output of the OR circuit OR1 is always at the high level irrespective of the control signal S2 input to the external terminal P1. That is, when the fuse F2 is not cut through melting and the semiconductor circuit 2 is in the operating state, the operation of the operational amplifier OP is always effective.

Further, when the semiconductor circuit 2 is in a stop state (state with no input voltage Vdd being applied) or the fuse F2 is cut through melting, the potential of the drain terminal of the MOS transistor Tr3 is the same potential (low level) as the ground. Thus, the output of the OR circuit matches with the control signal S2 input to the external terminal P1. That is, when the fuse F2 is cut through melting, the operation of the operational amplifier OP (semiconductor circuit 2) is controlled effectively or ineffectively based on the control signal S2 input to the external terminal P1.
<Operation of Second Logic Circuit RG2 Based on Control Signal S2>

The NOT circuit NT2 included in the second logic circuit RG2 inverts the control signal S2 input to the external terminal P1 and outputs it as a signal S1. Specifically, when a low-level control signal S2 is applied to the external terminal P1 (terminal RG2a), the second logic circuit RG2 outputs a high level signal S1 from the terminal RG2b.

Further, when a high-level control signal S2 is applied to the external terminal P1, the second logic circuit RG2 outputs a low level signal S1 from the terminal RG2b.

Since subsequent configurations are similar to those in the above-described embodiment, their description will be omitted.

<Summary of Second Embodiment>

As described above, the semiconductor circuit 2 according to the present embodiment is further equipped with the fuse F2. The operational amplifier OP is equipped with the terminal OPd input with the control signal S2 which controls the operation of the operational amplifier OP to be effective or ineffective. The control signal S2 input from the external terminal P1 is provided to the terminal OPd through the first logic circuit RG1.

In the semiconductor circuit 2 according to the present embodiment, the operation of the operational amplifier OP is always controlled effectively irrespective of the control signal S2 input to the external terminal P1 until cutting of the fuse F2. After the cutting of the fuse F2, the operation of the operational amplifier OP is controlled based on the signal S1 input to the external terminal P1.

Thus, in the semiconductor circuit 2 according to the present embodiment, the external terminal P1 can be used as the input terminal for the signal (signal S1) which switches between the desired output voltage and the inspection voltage until the cutting of the fuse F2 through melting. After the cutting of the fuse F2 (e.g., after the inspection such as screening is done), the external terminal P1 can be used as the chip enable terminal. Therefore, according to the semiconductor circuit 2 according to the present embodiment, it is possible to inspect the MOS transistor Tr1 with a simple configuration by using the terminal (external terminal P1 being the chip enable terminal in this one example) used for the normal operation of the semiconductor circuit 2.

Third Embodiment

A third embodiment of the present invention will hereinafter be described with reference to the accompanying drawings.

The second embodiment has described the semiconductor circuit 2 which switches between the desired output voltage and the inspection voltage by using the external terminal P1 being the chip enable terminal as the input terminal for the signal S1.

The third embodiment will describe a semiconductor circuit 3 which switches between a desired output voltage and an inspection voltage by using an external terminal P1 and which is capable of confirming whether the external terminal P1 functions as a chip enable terminal.

Incidentally, configurations similar to those in the above-described embodiment are assigned the same reference numerals, and their description will be omitted.

<Configuration of Semiconductor Circuit>

Figure 3:
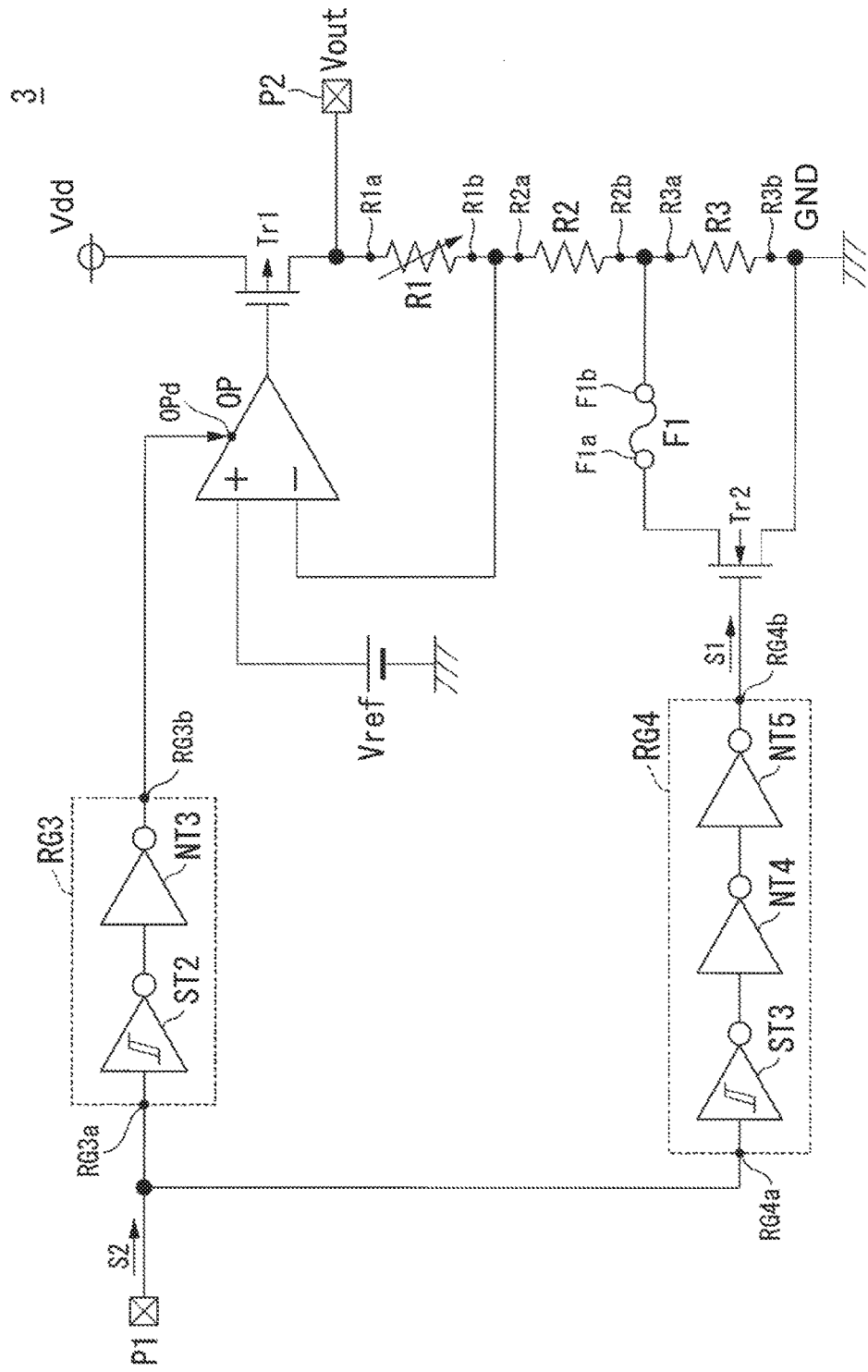
FIG. 3 is a circuit diagram illustrating a semiconductor circuit according to a third embodiment.

FIG. 3 is a circuit diagram illustrating the semiconductor circuit 3 according to the third embodiment.

As illustrated in FIG. 3, the semiconductor circuit 3 according to the present embodiment is equipped with an operational amplifier OP, a MOS transistor Tr1, a MOS transistor Tr2, a fuse F1, a first resistor R1, a second resistor R2, a third resistor R3, the external terminal P1, a voltage output terminal P2, a third logic circuit RG3, and a fourth logic circuit RG4.

The third logic circuit RG3 is equipped with a first terminal (terminal RG3a) and a second terminal (terminal RG3b). The fourth logic circuit RG4 is equipped with a first terminal (terminal RG4a) and a second terminal (terminal RG4b).

A terminal OPd and the external terminal P1 are connected through the third logic circuit RG3. Specifically, the external terminal P1 and the terminal RG3a are connected. The terminal RG3b and the terminal OPd are connected. Further, a gate terminal of the MOS transistor Tr2 and the external terminal P1 are connected through the fourth logic circuit RG4. Specifically, the external terminal P1 and the terminal RG4a are connected. The terminal RG4b and the gate terminal of the MOS transistor Tr2 are connected.

The third logic circuit RG3 is equipped with a Schmidt trigger ST2 and a NOT circuit NT3. The Schmidt trigger ST2 and the NOT circuit NT3 are connected in series between the terminal RG3a and the terminal RG3b in the order of the Schmidt trigger ST2 and the NOT circuit NT3. The Schmidt trigger ST2 inverts a control signal S2 input thereto and outputs the same therefrom.

The fourth logic circuit RG4 is equipped with a Schmidt trigger ST3, a NOT circuit NT4, and a NOT circuit NT5. The Schmidt trigger ST3, the NOT circuit NT4, and the NOT circuit NT5 are connected in series between the terminal RG4a and the terminal RG4b in the order of the Schmidt trigger ST3, the NOT circuit NT4, and the NOT circuit NT5. The Schmidt trigger ST3 inverts the control signal S2 input thereto and outputs the same therefrom.

Incidentally, the NOT circuit NT3, the NOT circuit NT4, and the NOT circuit NT5 are provided corresponding to the operation logic of the terminal OPd of the operational amplifier OP and the MOS transistor Tr2.

<Operation of Semiconductor Circuit 3>

A description will be made below about the operation of the semiconductor circuit 3.

As described above, the external terminal P1 is of the chip enable terminal. Further, when the semiconductor circuit 2 is made effective, a high level potential is applied to the external terminal P1 as the control signal S2. Also, when the semiconductor circuit 2 is made ineffective, a low level potential is applied to the external terminal P1 as the control signal S2.

Here, the Schmidt trigger ST2 and the Schmidt trigger ST3 are respectively different in terms of a threshold value relative to the input signal (control signal S2 in this example). In the subsequent description, the threshold value of the Schmidt trigger ST2 is described as a threshold value TH2, and the threshold value of the Schmidt trigger ST3 is described as a threshold value TH3. One example of the present embodiment will describe a case where the threshold value TH3 is larger than the threshold value TH2 between the threshold values TH2 and TH3

Further, one example of the present embodiment will describe a case where the voltage (control signal S2) input to the external terminal P1 as the control signal S2 is transitioned in the order of a first state, a second state, and a third state. Specifically, the control signal S2 is a voltage larger than the threshold value TH3 and the threshold value TH2 in the first state. Also, the control signal S2 is a voltage smaller than the threshold value TH3 and larger than the threshold value TH2 in the second state. Further, the control signal S2 is a voltage smaller than the threshold value TH3 and the threshold value TH2 in the third state.

<Operation of Third Logic Circuit RG3 Based on Control Signal S2>

When the voltage of the control signal S2 is larger than the threshold value TH2, the Schmidt trigger ST2 outputs a high level signal. Further, when the voltage of the control signal S2 is smaller than the threshold value TH2, the Schmidt trigger ST2 outputs a low level signal. Thus, when the voltage of the control signal S2 input to the external terminal P1 is larger than the threshold value TH2, the high level signal is supplied from the terminal RG3b and input to the terminal OPd. Further, when the voltage of the control signal S2 input to the external terminal P1 is smaller than the threshold value TH2, the low level signal is supplied from the terminal RG3b and input to the terminal OPd.

<Operation of Fourth Logic Circuit RG4 Based on Control Signal S2>

When the voltage of the control signal S2 is larger than the threshold value TH3, the Schmidt trigger ST3 outputs a high level signal. Further, when the voltage of the control signal S2 is smaller than the threshold value TH3, the Schmidt trigger ST3 outputs a low level signal. Thus, when the voltage of the control signal S2 input to the external terminal P1 is larger than the threshold value TH3, the low level signal is supplied from the terminal RG4b and input to the gate terminal of the MOS transistor Tr2. Further, when the voltage of the control signal S2 input to the external terminal P1 is smaller than the threshold value TH3, the high level signal is supplied from the terminal RG4b and input to the gate terminal of the MOS transistor Tr2.

<Concerning the Details of Each State>

A description will be made below about the details of the first state, second state, and third state with reference to FIG. 4.

FIG. 4 is a table illustrating the relationship between each state according to the third embodiment, the operation of the operational amplifier OP, and the state of the MOS transistor Tr2.

As illustrated in FIG. 4, in the first state, the operation of the operational amplifier OP is controlled effectively, and the state of the MOS transistor Tr2 is controlled to an OFF state. Also, in the second state, the operation of the operational amplifier OP is controlled effectively, and the state of the MOS transistor Tr2 is controlled to an ON state. Further, in the third state, the operation of the operational amplifier OP is controlled ineffectively, and the state of the MOS transistor Tr2 is controlled to the ON state.

<Summary of Third Embodiment>

As described above, the semiconductor circuit 3 according to the present embodiment is equipped with the third logic circuit RG3 equipped with the Schmidt trigger ST2, and the fourth logic circuit RG4 equipped with the Schmidt trigger ST3. In the semiconductor circuit 3 according to the present embodiment, the threshold values of the Schmidt triggers ST2 and ST3 are respectively different. Accompanying the action of changing the voltage applied to the external terminal P1 as the control signal S2, the semiconductor circuit 3 according to the present embodiment outputs the desired output voltage (output voltage Vout1) and outputs the inspection voltage (output voltage Vout2) to thereby bring the operation of the semiconductor circuit 3 (operational amplifier OP) to the ineffective state.

When the voltage of the control signal S2 is higher than the threshold value TH2 and the threshold value TH3, the semiconductor circuit 3 according to the present embodiment outputs the desired output voltage (output voltage Vout1). Thus, the semiconductor circuit 3 according to the present embodiment is capable of confirming whether the desired output voltage (output voltage Vout1) is supplied from the semiconductor circuit 3.

Also, when the voltage of the control signal S2 is higher than the threshold value TH2 and is lower than the threshold value TH3, the semiconductor circuit 3 according to the present embodiment applies an inspection voltage higher than a normal voltage between the gate terminal of the MOS transistor Tr1 and the source terminal thereof. Thus, when performing an inspection such as screening on the semiconductor circuit 3, the semiconductor circuit 3 according to the present embodiment is capable of applying an inspection voltage higher than a desired output voltage between the gate terminal of the MOS transistor Tr1 and the source terminal thereof.

Further, when the voltage of the control signal S2 is a voltage lower than the threshold value TH2 and the threshold value TH3, the semiconductor circuit 3 according to the present embodiment controls the operation of the operational amplifier OP to be ineffective. Thus, the semiconductor circuit 3 according to the present embodiment is capable of inspecting based on the input from the chip enable terminal (external terminal P1 in this one example) whether the operation of the operational amplifier OP is controlled.

Thus, according to the semiconductor circuit 3 according to the present embodiment, the semiconductor circuit 3 switches between the desired output voltage and the inspection voltage by using the external terminal P1 and is capable of confirming whether the external terminal P1 functions as the chip enable terminal.

Incidentally, although the above description has been made about the case where the voltage (control signal S2) input to the external terminal P1 as the control signal S2 is transitioned in the order of the first, second and third states, the present invention is not limited to it. The control signal S2 may be configured to be transitioned in the order of the third, second and first states.

What is claimed is:

1. A semiconductor circuit converting an input voltage applied thereto to a predetermined output voltage and supplying the same from a voltage output terminal, the semiconductor circuit, comprising:
a MOS transistor;
an operational amplifier;
a first resistor;
a second resistor;
a third resistor;
an external terminal; and
a switch,
the first resistor, the second resistor, and the third resistor being connected in series between the voltage output terminal and a ground terminal in this order,
the MOS transistor having a source terminal connected to an input voltage terminal to which the input voltage is applied, and a drain terminal connected to the voltage output terminal,
the operational amplifier having a non-inversion input terminal to which a reference voltage is applied, an inversion input terminal to which a voltage of a connection point of the first resistor and the second resistor is applied, and an output terminal to which a gate terminal of the MOS transistor is connected,
the switch having a control terminal connected to the external terminal and being connected in parallel with the third resistor,
an open state of the switch brought by a signal input to the external terminal, permitting an output of the output voltage from the voltage output terminal based on a voltage divided between the first resistor and a combined resistance of the second resistor the third resistor, and
a closed state of the switch brought by the signal input to the external terminal, permitting an output of the output voltage from the voltage output terminal based on a voltage divided between the first resistor and the second resistor.

2. The semiconductor circuit according to claim 1, further comprising a first fuse connected in series between the switch and the third resistor,
wherein cutting of the first fuse cuts a connection between the switch and the third resistor.

3. The semiconductor circuit according to claim 1, further comprising a second fuse,
wherein the operational amplifier has an input terminal to which a control signal which controls the operation of the operational amplifier to be effective or ineffective is provided,
wherein the input terminal and the external terminal are connected through a logic circuit,
wherein the input terminal and the input voltage terminal are connected through a logic circuit and the second fuse,
wherein the input voltage is provided to the input terminal as the control signal until cutting of the second fuse,
wherein the signal is provided to the input terminal as the control signal after the cutting of the second fuse, and
wherein the operational amplifier is always controlled to be effective until the cutting of the second fuse, and controlled based on the signal input to the external terminal after the cutting of the second fuse.

4. The semiconductor circuit according to claim 1, further comprising a first logic circuit and a second logic circuit each operating according to the magnitude of the signal and each having a different threshold value against the signal,
wherein the operational amplifier has an input terminal to which a control signal for controlling the operation of the operational amplifier to be effective or ineffective is provided,
wherein the input terminal and the external terminal are connected through the first logic circuit,
wherein the control terminal and the external terminal are connected through the second logic circuit,
wherein the operational amplifier operates based on the signal input through the first logic circuit,
wherein the switch operates based on the signal input through the second logic circuit, and
wherein the voltage divided by the combined resistance and the first resistor or the voltage divided by the second resistor and the first resistor is supplied as the output voltage.

5. The semiconductor circuit according to claim 2, further comprising a second fuse,
wherein the operational amplifier has an input terminal to which a control signal which controls the operation of the operational amplifier to be effective or ineffective is provided,
wherein the input terminal and the external terminal are connected through a logic circuit,
wherein the input terminal and the input voltage terminal are connected through a logic circuit and the second fuse,
wherein the input voltage is provided to the input terminal as the control signal until cutting of the second fuse,
wherein the signal is provided to the input terminal as the control signal after the cutting of the second fuse, and
wherein the operational amplifier is always controlled to be effective until the cutting of the second fuse, and controlled based on the signal input to the external terminal after the cutting of the second fuse.

6. The semiconductor circuit according to claim 2, further comprising a first logic circuit and a second logic circuit each operating according to the magnitude of the signal and each having a different threshold value against the signal,
wherein the operational amplifier has an input terminal to which a control signal for controlling the operation of the operational amplifier to be effective or ineffective is provided,
wherein the input terminal and the external terminal are connected through the first logic circuit,
wherein the control terminal and the external terminal are connected through the second logic circuit,
wherein the operational amplifier operates based on the signal input through the first logic circuit,
wherein the switch operates based on the signal input through the second logic circuit, and
wherein the voltage divided by the combined resistance and the first resistor or the voltage divided by the second resistor and the first resistor is supplied as the output voltage.

* * * * *